United States Patent [19]

Magdo

[11] Patent Number: 4,534,806
[45] Date of Patent: Aug. 13, 1985

[54] METHOD FOR MANUFACTURING VERTICAL PNP TRANSISTOR WITH SHALLOW EMITTER

[75] Inventor: Ingrid E. Magdo, Hopewell Junction, N.Y.

[73] Assignee: International Business Machines Corporation, Armonk, N.Y.

[21] Appl. No.: 472,897

[22] Filed: Mar. 7, 1983

Related U.S. Application Data

[63] Continuation of Ser. No. 99,695, Dec. 3, 1979, abandoned.

[51] Int. Cl.³ .................. H01L 21/265; H01L 21/225
[52] U.S. Cl. .................... 148/1.5; 29/576 B; 148/175; 148/187; 357/34; 357/91
[58] Field of Search .......... 148/1.5, 187, 175; 29/576 B; 357/34, 91

[56] References Cited

U.S. PATENT DOCUMENTS

| | | | |
|---|---|---|---|
| 4,029,527 | 6/1977 | Glasl et al. ................... | 148/187 |
| 4,063,967 | 12/1977 | Graul et al. .................. | 148/1.5 |
| 4,151,006 | 4/1979 | DeGraaff et al. ............. | 148/1.5 |
| 4,167,425 | 9/1979 | Herbst ......................... | 148/1.5 |
| 4,234,357 | 11/1980 | Scheppele .................... | 148/1.5 |
| 4,357,622 | 11/1982 | Magdo et al. ................ | 357/44 |
| 4,437,897 | 3/1984 | Kemlage ...................... | 148/1.5 |
| 4,452,645 | 6/1984 | Chu et al. ..................... | 148/1.5 |

OTHER PUBLICATIONS

Graul et al, IEEE Jour. Solid St. Circuits, SC-11, (1976), p. 491.

Primary Examiner—Upendra Roy

[57] ABSTRACT

A PNP semiconductor device and a manufacturing method therefore. In the method, a window is formed on the surface of a semiconductor substrate having an N-type base region formed therein. A polycrystalline layer is formed on the base region in the window. The polycrystalline silicon layer is ion implanted under specific predetermined conditions with a P-type doping ion. The P-type doping ion is diffused by an annealing treatment under predetermined conditions into the base region to form a shallow emitter region.

10 Claims, 16 Drawing Figures

METHOD FOR MANUFACTURING VERTICAL PNP TRANSISTOR WITH SHALLOW EMITTER

This application is a continuation of Ser. No. 099,695 filed Dec. 3, 1979, now abandoned.

FIELD OF THE INVENTION

The present invention is directed to a method for the manufacture of shallow P-doped emitter regions in the manufacture of PNP transistor structures. More particularly, the present invention is directed to a PNP transistor structure with a shallow emitter region which is free of structural silicon defects and to complementary integrated transistor structures having both PNP and NPN transistors.

BACKGROUND OF THE INVENTION

It has long been a goal in the semiconductor industry to produce PNP type transistors which have electrical characteristics approximately equivalent to NPN transistors and to provide complementary semiconductor structures having both NPN and PNP transistors. It is well known, however, that the gain and frequency response of PNP transistors is substantially less than that of NPN transistors. It has been believed that a significant advance in producing PNP transistors with high performance characteristics could be accomplished by providing a shallow P-doped emitter region with controlled doping concentration which is free from structural damage. By shallow emitter region is meant an emitter region having a depth from the silicon surface of less than about 3000 Å. Numerous problems have been encountered in producing shallow P-doped emitter regions. For example, ion implantation of high dosages of boron into the surface of monocrystalline silicon provides a very high density of dislocation loops which extend about 500 Å below the implant surface. With increasing depth below the implant surface, these loops coagulate into very dense tangles of dislocations which extend down to about 2000 Å. Attempts to anneal these dislocations by heat treatment have been ineffectual. After annealing heat treatment a further layer of stacking faults is found to exist at a depth of from about 2000–5000 Å. The stacking faults occupy a volume of the monocrystalline silicon which had not been implanted but are created by boron drive-in diffusion during the annealing heat treatment.

Attempts to produce P-type emitter regions by ion implantation with lower concentrations of boron are also ineffectual. The lower dosages result in the provision of concentrations of doping ions which are unacceptable to provide the required electrical properties. If the dosage is increased, the dislocation effects discussed above are incurred and the dislocations can not be cured by annealing.

A still further problem exists in that the diffusion rate of boron into the silicon structure is very fast. Any attempts to anneal the dislocation damage caused by providing the proper concentration of boron results in a drive-in depth of the diffused boron ions which is unacceptable. Accordingly, PNP transistors have been produced by methods other than ion implantation in the emitter region.

Similar problems have not existed in respect to the manufacture of NPN transistors. Ion implantation damage caused during implantation of N-type doping ions is more easily cured by annealing. While some dislocation faults, basically at the surface of the silicon, remain after annealing silicon implanted with N-type doping ions, transistor structures produced by ion implantation of N-type doping ions in the emitter region have been acceptable both as to depth of the emitter region and number and extent of dislocation faults. Nevertheless, while ion implanted N-type emitters have been generally accepted, numerous methods have been designed to improve this type of emitter. U.S. Pat. No. 3,460,007 to Scott, for example, describes a method for forming a P-N junction wherein N-doped polycrystalline silicon is deposited in-situ on the surface of monocrystalline silicon. The structure is subsequently heated to drive the N-type conductivity ion into the surface of the monocrystalline silicon to form an emitter region. Certain advantages are claimed for an N-doped emitter region formed in this manner.

An article by Graul et al., IEEE Journal of Solid State Circuits, Vol. SC-11, No. 4, August 1976, pp. 491–493 describes a method for forming an emitter region for an NPN transistor. In the method, an undoped polysilicon layer is deposited on the surface of a monocrystalline silicon surface. The polysilicon layer is implanted with an N-type doping ion, such as arsenic. The arsenic is then driven into the surface of the monocrystalline silicon to form an emitter region. Better emitter efficiency and higher current carrying capability are indicated to be provided by this method for forming an N-doped emitter region in an NPN transistor.

Because of differences in the physical characteristics between N-type doping ions and P-type doping ions, it has been believed that the diffusion of the doping ion from polysilicon is not a suitable method for the formation of P-type emitter regions. In the case of the in-situ doped polysilicon, it is not possible to obtain a high enough concentration of P-type doping ion to provide the emitter region with a suitable concentration level of P-type dopant. A further problem is that the drive-in characteristics of P-type doping ions were believed to be unsuitable for diffusion to provide a shallow emitter. It was also believed that ion-implantation of undoped polysilicon would result in dislocations of the silicon surface which would be propogated during the drive-in heat treatment step. This conclusion is supported by the literature. For example, an article by Akasaka et al., "Application of Diffusion from Implanted Polycrystalline Silicon to Bipolar Transistors", Japanese Journal of Applied Physics, Vol. 15 (1976), Supplement 15-1, pp. 49–54, describes a method for providing a P-doped base area in a silicon surface by drive-in or diffusion from a polycrystalline layer adjacent the silicon surface. In the process, the polycrystalline silicon is implanted with boron at a low concentration level below the critical dosage known to cause damage to prevent incurring any surface damage at the interface between the polysilicon and the silicon. Thereafter, a drive-in heat treatment is used to diffuse the boron to a depth of about 10,000 Å to provide the base region.

There have been no reports or efforts made to produce a P-type emitter region in a PNP transistor by means of diffusion from a doped polysilicon layer, whether in-situ doped or doped by ion implantation.

SUMMARY OF THE INVENTION

The present invention is intended to advance the teachings of the above described prior art and has for its principle object a method for making a P-type emitter region in a PNP transistor device having improved operation.

Another object of the invention is to provide a PNP vertical bipolar transistor with improved electrical characteristics which has a shallow P-type emitter region.

Still another object of the invention is to provide a method for making a PNP transistor with greatly enhanced gain and frequency response.

The semiconductor device manufacturing method of the present invention includes a process in which a window is formed on the surface of a semiconductor substrate having an N-type base region formed therein. A polycrystalline silicon layer is formed on the base region in the window. The polycrystalline silicon layer is ion implanted under specific predetermined conditions with a P-type doping ion. The P-type doping ion is diffused by an annealing treatment under specific predetermined conditions into the base region to form a shallow emitter region.

The objects and advantages of the present invention will become more apparent from the following detailed description taken in conjunction with the accompanying drawings.

DESCRIPTION OF THE PREFERRED EMBODIMENTS

Figure 1:
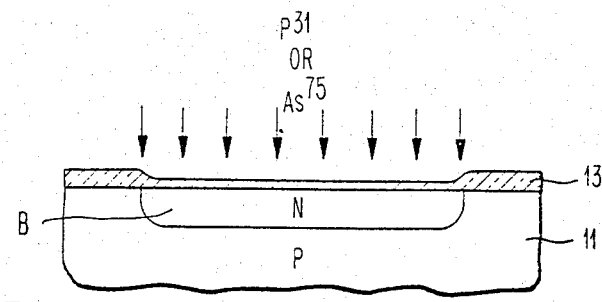
FIGS. 1 to 4 are schematic cross-sectional views showing various steps employed in producing a PNP vertical transistor according to a first example of the invention.
Figure 2:
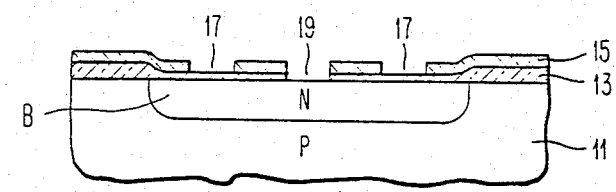
Figure 3:
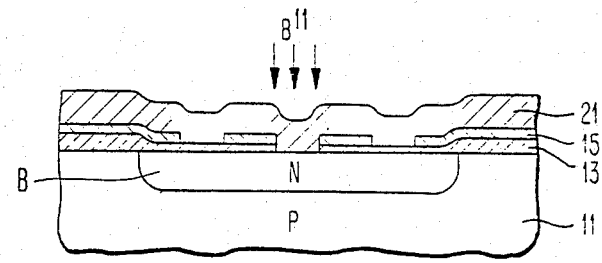

FIGS. 1 to 4, inclusive, illustrate one example of the steps employed in producing a PNP semiconductor device according to the invention. A base region B and a reach-through subcollector contact region (not shown) are formed by known means in a monocrystalline silicon semiconductor substrate 11, as shown in FIG. 1. The base region B is covered with a silicon dioxide film 13 formed during impurity diffusion.

A silicon nitride film 15 is formed over the silicon dioxide film 11. Base contact windows 17 and emitter window 19 are formed through the silicon nitride layer 15 by usual photoetching techniques. The emitter window 19 is opened through the silicon dioxide layer 13 by etching the silicon dioxide film 13 with an etchant for silicon dioxide (for example, hydrochloric acid by the wash-out method) or by reactive ion etching techniques.

Figure 4:
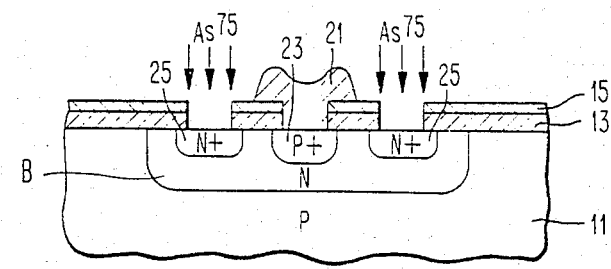

Thereafter, a polycrystalline silicon layer 21 is grown over the entire surface of the substrate assembly. The polycrystalline silicon layer 21 is bombarded by ion implantation under specific conditions to be described more fully hereinbelow with a P-type doping ion. The P-type doping ion is preferably boron. The polycrystalline silicon layer is then etched in the pattern of an emitter electrode as shown in FIG. 4. The substrate assembly is eventually treated by thermal heating or other suitable annealing methods, such as laser treatment, under particular conditions to diffuse the boron from the polycrystalline layer into the base region B to provide a P+emitter region 23.

Next the area of the silicon dioxide film 13 exposed through the window 17 is removed by the hydrochloric acid wash-out method or by RIE to extend the window 17 down to the surface of the substrate 11. Base contact regions 25 are then formed by ion implantation of an N-type dopant, such as $AS^{75}$ or $P^{31}$. The structure is subsequently metallized in accordance with known practice. Since the doped polysilicon is sufficiently conducting to provide a good ohmic contact with the emitter region 23, the polysilicon remaining above the emitter region 23 can be left as shown in FIG. 4, or can be removed by suitable photoetching technique.

Figure 5:
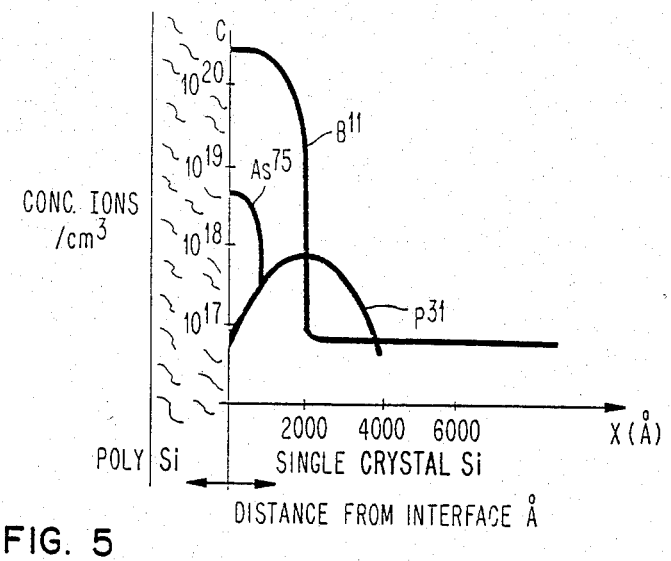
FIG. 5 is a diagram showing one possible doping profile for the transistor structure of FIG. 4.

The doping profile of the PNP transistor provided by the above described method is set forth in FIG. 5. As shown, the emitter region, defined by the $B^{11}$ profile, is very shallow and extends only to about 2000 Å. The concentration gradient of the emitter region is extremely steep indicating a very acceptable profile. The beta (current gain) values for PNP transistor devices of the invention are very high compared to known PNP devices. Beta values of greater than 200 have been obtained compared to a beta of less than 10 for conventional PNP devices. The cut off frequency ($f_T$) is also high, i.e., 3.6 GHz, compared to 500 MHz for conventional PNP devices.

The vertical, bipolar PNP transistor structure of the invention can be characterized as having an emitter region with a concentration of P-type doping ions of at least $1 \times 10^{19}$ ions/cm$^3$ extending to a depth of at least 2000 Å and of less than about $1 \times 10^{16}$ ions/cm$^3$ at a depth of 3500 Å from the surface of the monocrystalline silicon after drive-in. Preferably the emitter region has a concentration of at least $5 \times 10^{19}$ ions/cm$^3$ extending to a depth at least 1500 Å and of less than about $1 \times 10^{17}$ ions/cm$^3$ at a depth of 3000 Å. The concentration characteristics of the P-type emitter of the transistor structure of the invention provide a concentration gradient curve (refer to FIGS. 10, 12 and 14) characterized by high, uniform doping concentration near the surface of the monocrystalline silicon substrate which extends only a shallow distance from the surface and then has a very steep concentration gradient decline. These emitter region characteristics are believed to account for the significant improvement in gain and frequency response attained by the PNP transistor structure of the invention.

Figure 6:
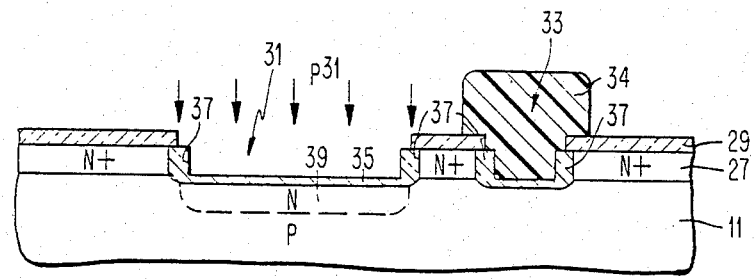
FIGS. 6 to 8, inclusive, show various steps employed in producing a PNP type vertical bipolar transistor according to a second example of the invention wherein a double polysilicon method is used.
Figure 7:
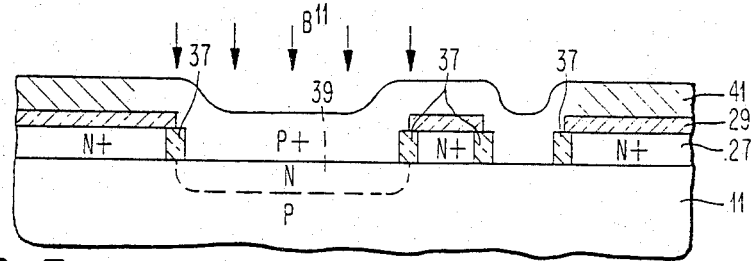
Figure 8:
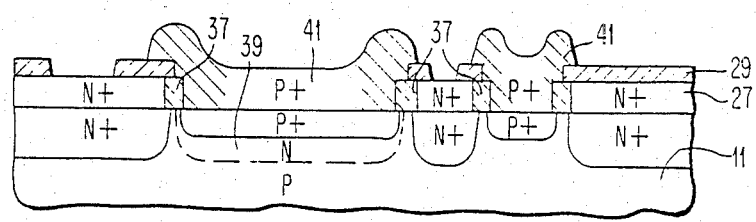

The method of the invention can be used in the preparation of PNP-type transistors by a double polysilicon technique. One such method is illustrated in FIGS. 6 through 8 inclusive. In the illustrated method, a layer of polysilicon 27 is deposited on a monocrystalline silicon substrate 11. The polysilicon layer 27 is doped with an N-type dopant by ion implantation or other suitable methods. A layer of pyrolytic silicon dioxide 29 is deposited on the polysilicon layer 27. An intrinsic base region 31, which is co-extensive with a subsequent emitter region, is opened in the silicon dioxide layer 29 and the polysilicon layer 27. A collector contact region 33 is opened and coated with photoresist 34 as shown in FIG. 6.

Subsequent to opening the collector contact region 33 and the intrinsic base region 31 the structure is submitted to a re-oxidation step to provide the silicon dioxide layer 35. Since N-doped polysilicon oxidizes at a rate of about 4 times faster than the low-doped monocrystalline silicon, the oxide 37 formed on the sidewall of the polysilicon provides a barrier for the subsequently formed emitter-base junction. This permits the emitter-base junction to be terminated under thermal silicon dioxide. An intrinsic base region 39 is then formed by ion implantation of a suitable N-type dopant such as $P^{31}$ or $AS^{75}$.

A second layer of polysilicon 41 is then deposited over the structure as shown in FIG. 7. The second layer of polysilicon is implanted with $B^{11}$. Thereafter, the subsequent processing is identical to the single polysilicon emitter PNP transistor device previously described in respect to FIGS. 1 through 4. The subsequent processing steps are illustrated in FIGS. 7 and 8.

The provision of a P-doped emitter region in accordance with the present invention is related to the thickness of the polysilicon layer, the ion dosage, the energy used to implant the ion dosage, and the total time-temperature conditions which the transistor structure is submitted to after the ion implantation step. Very generally, it has been discovered that if ion implantation of boron, or other P-type dopant, in the polysilicon layer takes place under conditions whereby the concentration of ions at the interface between the polysilicon layer and the monocrystalline silicon layer is less than the concentration peak of a critical dosage of P-type doping ion the damage incurred during the ion implantation step is insufficient to cause disruption of the monocrystalline silicon layer. Moreover, if the dosage level requirements of the present invention are observed, the drive-in during an annealing step is such as to create a very shallow and highly concentrated emitter region with an extremely steep concentration gradient which is highly suitable for providing the emitter region of a PNP transistor device.

It should be understood that the dosage used in the ion implantation of the P-type dopant in accordance with the invention is in excess of the critical dosage which has been heretofore known to cause irreparable dislocation damage in the implantation of P-type dopants. That is, while the total dosage level for the P-type dopant is in excess of a heretofore known critical level of dosage for this type dopant, the conditions set forth for the implantation of the P-type dopant are such that damage is avoided and an extremely desirable concentration gradient in a shallow emitter form is attained in the surface of the monocrystalline silicon.

Figure 16:
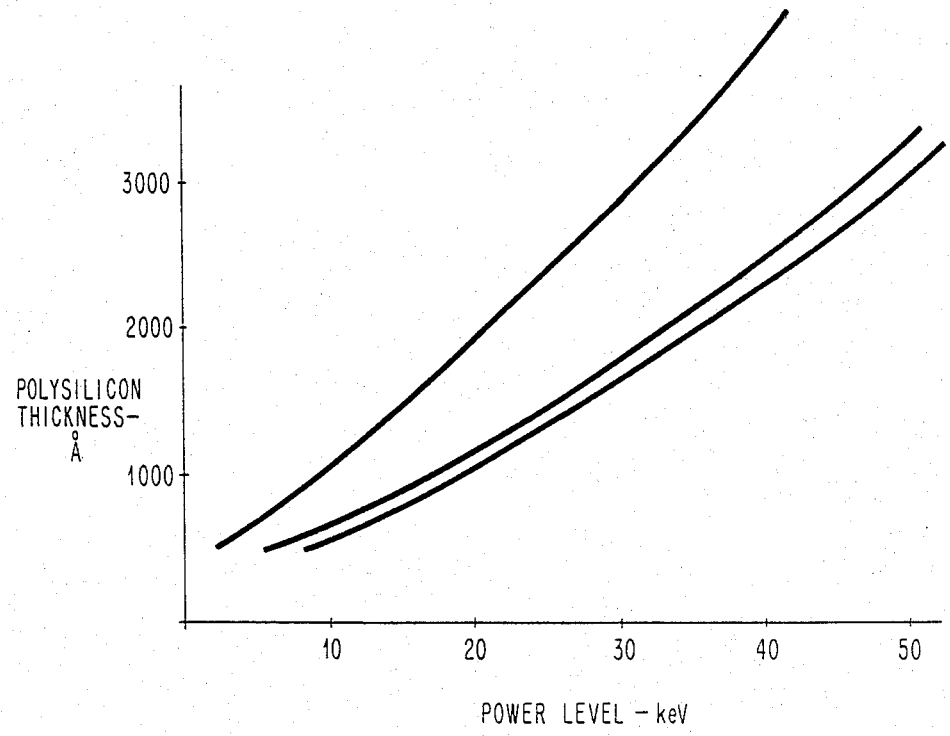
FIG. 16 is a graph showing various operating parameters useful in the practice of the invention.

The critical dosage for P-type dopants in monocrystalline silicon is about $1 \times 10^{15}$ ions/cm$^2$. The dosage level useful in the present invention is in the range of from about $1 \times 10^{16}$ to about $1 \times 10^{17}$ ions/cm$^2$. The power level used to implant the P-type dopant in the polysilicon is dependent upon the thickness of the polysilicon layer. The relationship of power level to polysilicon layer thickness is illustrated by the plot of FIG. 16.

After implantation of the P-type dopant in the polysilicon layer, the P-type dopant is driven into the monocrystalline layer by an annealing step. The preferred method for effecting drive-in of the P-type dopant is by thermal annealing. Thermal heat treatment at a temperature of from about 900° C. to about 1100° C. for a period of from about 90 minutes at the lower temperature to about 2 minutes at the higher temperature has been found to be suitable. For ease of control, the thermal heat treatment is preferably at a temperature of from about 950° C. to 1000° C. for a period of from about 60 minutes at the low temperature to about 45 minutes at the high temperature. Most preferably the heat treatment is at 1000° C. for 30 minutes and other equivalent time-temperature relations. In this connection, it should be understood that the total heat treatment to which the transistor device is subjected after the implantation of the P-type dopant should not exceed the equivalent of the described suitable heat treatment conditions. If other ion implant areas requiring drive-in, such as base contact regions, are established in the transistor device, the drive-in should be effected before or concurrently with the emitter region drive-in.

EXAMPLES

Figure 9:
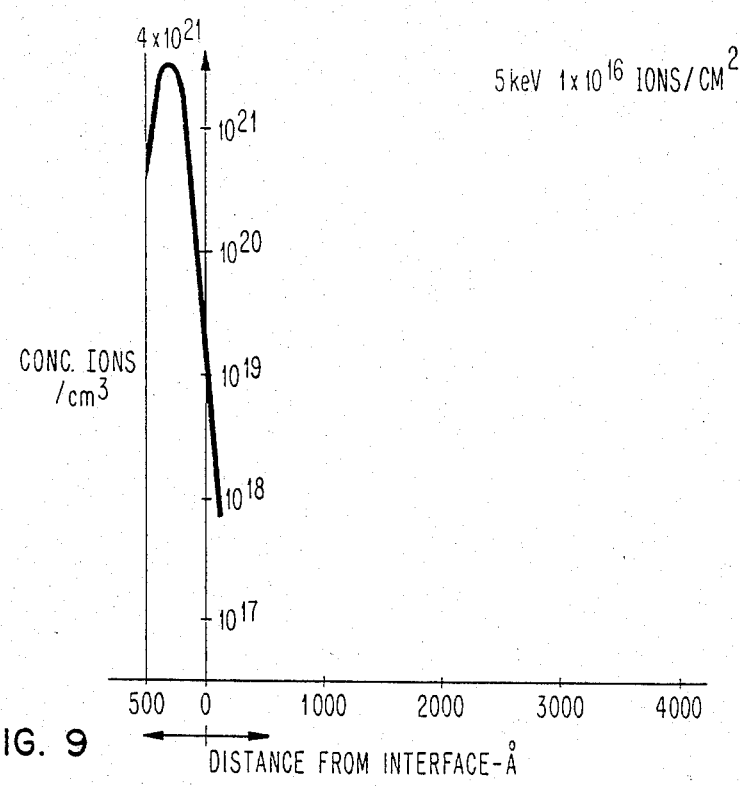
FIGS. 9 to 14 are graphs showing the relationship of various operating parameters of the invention.
Figure 10:
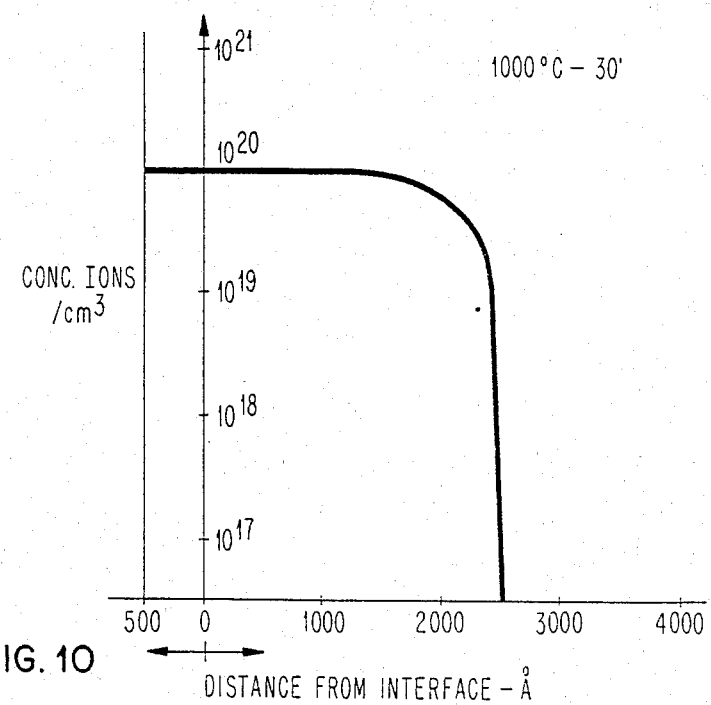

Various operating features of the invention are illustrated in FIGS. 9-14 for various thicknesses of polysilicon layers. As shown in FIG. 9, a polysilicon layer is deposited having a thickness of 500 Å. The polysilicon layer is implanted with boron ion at a dosage of $1 \times 10^{16}$ ions/cm$^2$. The energy used for the implantation is 5 keV. Under these conditions the distribution of the ions in the polysilicon layer after implantation is shown in FIG. 9. After the implantation step, the boron is driven into the monocrystalline silicon layer to provide an emitter region by annealing the transistor structure for a total period of 30 minutes at a temperature of 1000° C. The resulting distribution profile for the emitter region is shown in FIG. 10. From FIG. 10 it is seen that the concentration is uniform at about $10^{20}$ ions/cm$^3$ for a depth of about 2000 Å.

Referring to FIG. 9, it can be seen that the concentration of ions at the interface of the polysilicon layer and the monocrystalline layer is about $10^{19}$. The dosage required to provide a Gaussian distribution having a peak of about $10^{19}$ ions/cm$^3$ is about $2.5 \times 10^{14}$ ions/cm$^2$ at an energy level of about 5 keV. This is well below the critical dosage of $1 \times 10^{15}$ ions/cm$^2$. Accordingly, the conditions used for ion implantation to produce the structure illustrated in FIG. 9 meet the basic requirement of the present invention that the concentration of the ions at the interface should be less than would be produced by a critical dosage whose distribution peak occurs at the interface.

Figure 11:
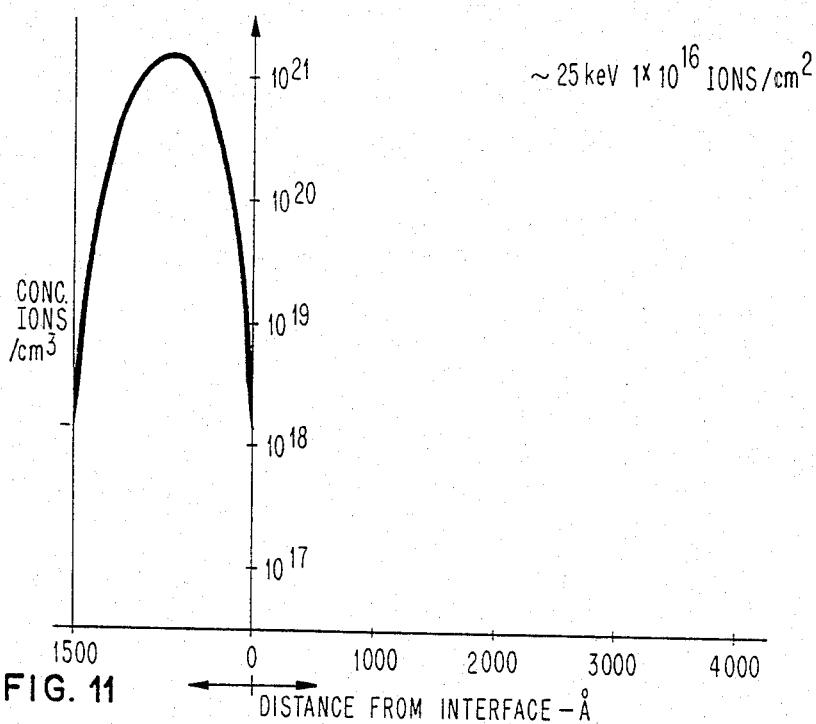
Figure 12:
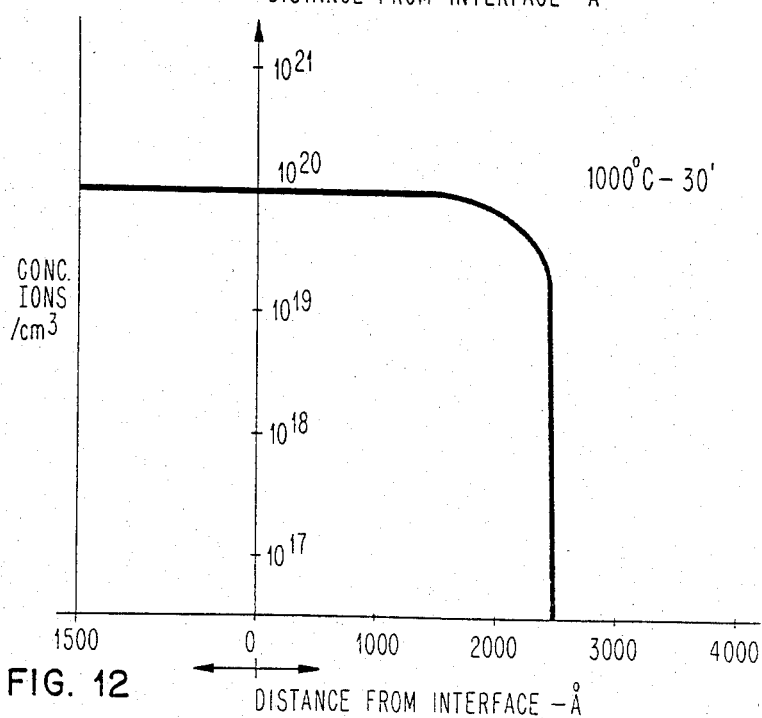

FIGS. 11 and 12 illustrate the distribution after ion implantation and after annealing for a polysilicon layer thickness of 1500 Å. The ion implantation is at a power level of 25 keV and a dosage of $10^{16}$ ions/cm$^2$. The annealing step is performed at a temperature of 1000° C. for 30 minutes.

Figure 13:
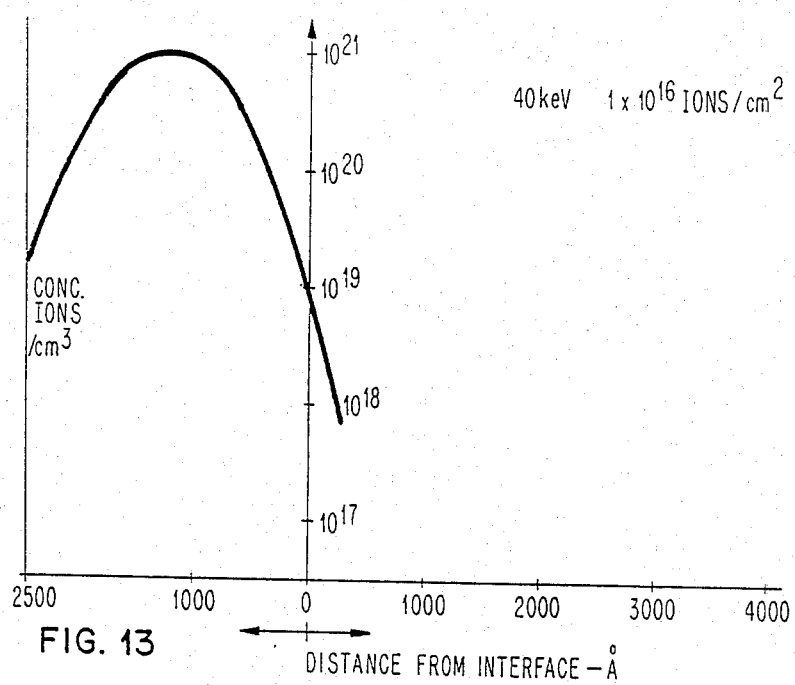
Figure 14:
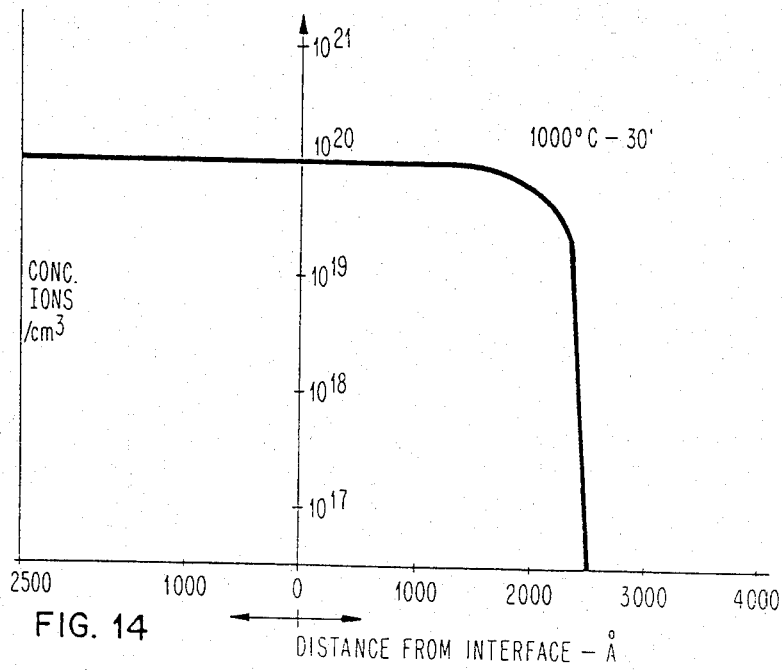

FIGS. 13 and 14 illustrate the concentration profile after ion implantation and the annealing step for a polysilicon layer thickness of 2500 Å. The ion implantation is performed at a power level of 40 keV and a dosage of $10^{16}$ ions/cm$^2$. The annealing step is performed at a temperature of 1000° C. for 30 minutes.

In each case illustrated in FIGS. 9-14, despite the varying thickness of the polysilicon layer, it is seen that the emitter region has approximately the same maximum concentration of ions and approximately the same depth. This means that the total loading of the polysilicon layer is approximately equivalent despite the thickness of the layer. The total loading of the implanted boron ions is compressed and the peak of the distribution is greater as the polysilicon layer is reduced in thickness.

Figure 15:
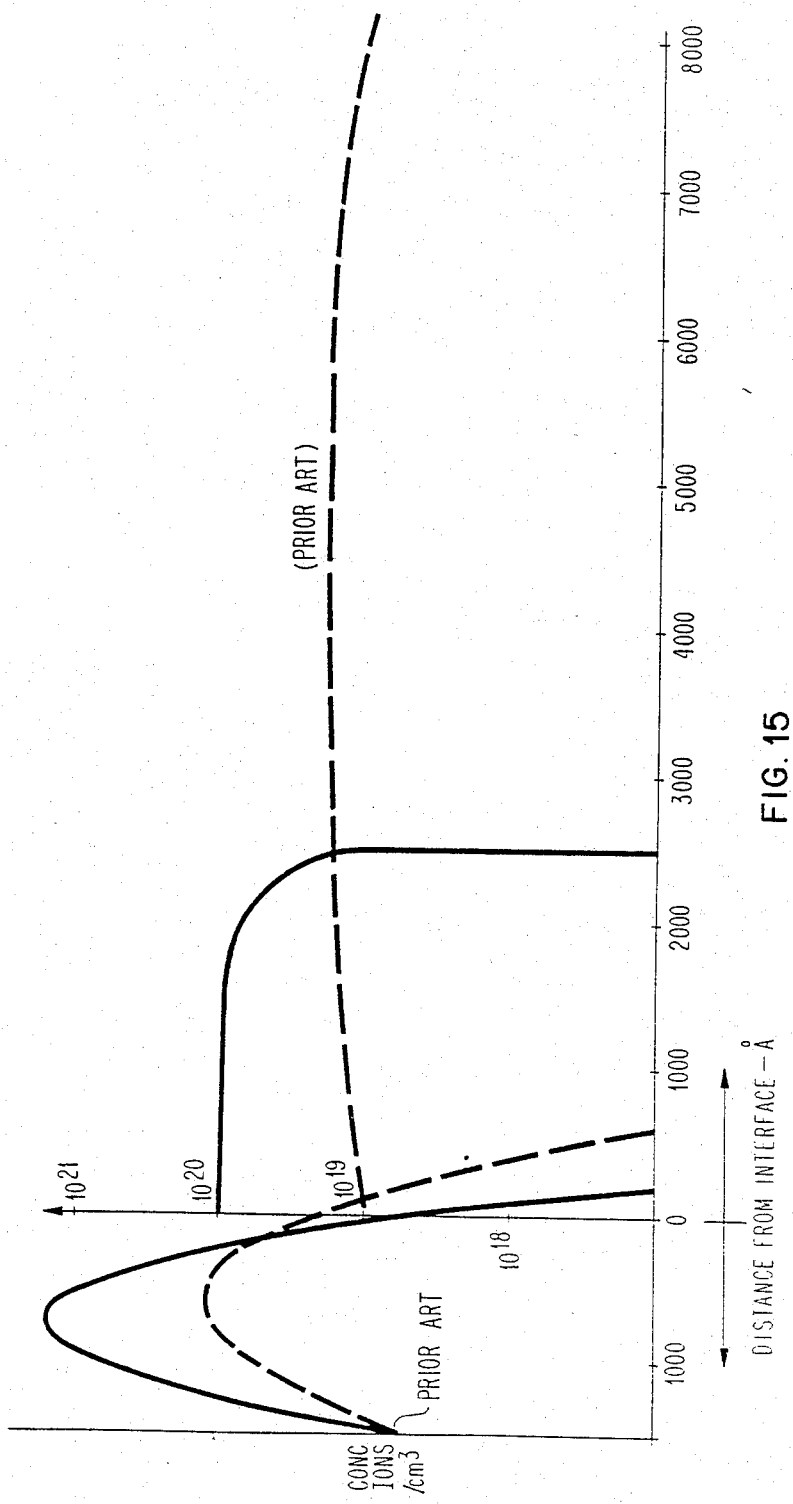
FIG. 15 is a graph showing the comparison of the emitter structure produced in accordance with the present invention to the prior art.

FIG. 15 illustrates differences in the operating conditions of the present invention as compared to the prior art. As shown in FIG. 15, the dashed line represents the ion implantation of boron in a polysilicon layer as described in the article of Akasaka et al., (cited previously). In the Akasaka article, boron is implanted in a polysilicon layer using a dosage of about that of the critical dosage. The dosage of the boron for a polysilicon thickness of 1500 Å was $1 \times 10^{15}$ ions/cm$^2$. The distribution in the polysilicon layer is as shown by the dashed line to the left of vertical interface line in FIG. 15. After annealing to drive in the boron to produce a base region, the distribution in the monocrystalline silicon layer is as shown in the dashed line to the right of the interface of FIG. 15. In accordance with the present invention using a dosage in excess of the critical dosage of $1 \times 10^{16}$ ions/cm$^2$ at a power level of 25 keV, the distribution shown by the solid line to the left of the interface in FIG. 15 is attained. After an annealing cycle, an emitter region having the distribution shown by the solid line to the right of the interface of FIG. 15 is attained.

In general, a dosage of from about $1 \times 10^{16}$ to about $1 \times 10^{17}$ ions/cm$^2$ is used to attain the desired loading of the polysilicon layer in accordance with the invention. The power level required to implant the dosage and attain the desired distribution within the polysilicon layer is related to the thickness of the polysilicon layer. In general, the optimum power level is that shown by the middle line in FIG. 16. Other power levels can be used and the minimum and maximum power level that can be used is represented by the lower and upper lines of the graph of FIG. 16. As an example, for a polysilicon layer thickness of 500 Å, a power level in the range of from about 2 to about 8 keV can be used. For a polysilicon layer thickness of 1500 Å, a power level in the range of from about 15 to about 27 keV can be used. For a polysilicon layer thickness of 2500 Å a power level in the range of from about 25 to about 43 keV can be used.

The present invention is not limited specifically to the foregoing examples but many modifications and variations may be affected without departing from the scope of the invention which is set forth in the appended claims.

I claim:

1. A process for forming a vertical PNP transistor having a high current gain exceeding about 200 and a high frequency response due to said transistor having a shallow, dislocation-free, P-type diffused emitter, said emitter further characterized by a steep concentration gradient, said process comprising the steps of:
   (a) providing a monocrystalline semiconductor silicon substrate having a subcollector region doped with a P-type impurity;
   (b) forming an N-type base region for said transistor in said substrate;
   (c) forming an insulator layer over said base region;
   (d) defining and forming an emitter window in said insulator layer exposing a planar surface region of said base region;
   (e) forming a polycrystalline silicon layer on said exposed planar surface of said base region;
   (f) doping said polycrystalline silicon layer with P-type impurities in a region adjacent to a desired emitter region to maintain a critical concentration of said P-type impurities at the interface between the polycrystalline silicon layer and the monocrystalline substrate below the concentration level of about $5 \times 10^{19}$ ions/cm$^3$; and
   (g) subjecting the resulting structure to conditions whereby the P-type doping ions contained in the polycrystalline silicon layer are controllably driven into the monocrystalline silicon forming an emitter region having a steep concentration gradient given by a concentration of P-type ions of at least $1 \times 10^{19}$ ions/cm$^3$ extending to a depth of at least 2000 Å and a concentration of less than about $1 \times 10^{16}$ ions/cm$^3$ at a depth of about 3500 Å from the surface of the monocrystalline silicon without effecting dislocations in the monocrystalline silicon.

2. A process in accordance with claim 1 wherein said polycrystalline silicon layer is doped with boron.

3. A process in accordance with claim 2 wherein said boron is ion implanted into said polycrystalline silicon layer at a dose of at least about $1 \times 10^{16}$ ions/cm$^2$.

4. A process in accordance with claim 2 or 3 wherein said polycrystalline silicon layer has a thickness of from about 500 to about 3000 Å.

5. A process in accordance with claim 4 wherein said boron is ion implanted into the surface of said polycrystalline silicon layer at a dosage of from about $1 \times 10^{16}$ to about $1 \times 10^{17}$ ions/cm$^2$ and at an energy of from about 2 to about 50 keV.

6. A process in accordance with claim 5 wherein the boron ion is driven into the monocrystalline silicon substrate by a heat treatment.

7. A process in accordance with claim 6 wherein the heat treatment is at a temperature of from about 900° to about 1100° C. for a time period of from about 90 minutes at the lower temperature to about 2 minutes at the higher temperature.

8. A process in accordance with claim 6 wherein the heat treatment is at a temperature from about 950° C. to about 1000° C. for a period of from about 60 minutes at the lower temperature to about 45 minutes at the higher temperature.

9. A process in accordance with claim 6 wherein the boron is driven into the monocrystalline substrate under heat conditions whereby the depth of the boron ions in the monocrystalline substrate is less than about 2500 Å.

10. A process for forming a vertical PNP transistor emitter having a shallow depth in the range of 2000 Å to 3000 Å, steep concentration gradient and free of dislocations, said process comprising:
   (a) providing a monocrystalline silicon substrate having a subcollector region doped with a P-type impurity;
   (b) forming an N-type base region for said transistor in said substrate;
   (c) forming an insulator layer over said base region;
   (d) defining and forming an emitter window in said insulator layer exposing a planar surface of said base region;
   (e) forming a polycrystalline silicon layer on said exposed planar surface;
   (f) ion implanting said polycrystalline silicon layer with boron ions of a low energy of 2 keV to 43 keV and dose in the range $(1-10) \times 10^{16}$ ions/cm$^2$ in a region adjacent to a desired emitter region to maintain a critical boron concentration at the interface between the polycrystalline silicon layer and the monocrystalline silicon of below approximately $5 \times 10^{19}$ ions/cm$^3$; and (g) subjecting the resulting structure to a thermal cycle to drive the boron ions contained in the polycrystalline layer into the monocrystalline silicon forming an emitter region, whereby said emitter has the characteristics of a shallow depth in the range 2000 Å to 3000 Å, a steep boron concentration gradient given by a concentration of boron ions of at least $5 \times 10^{19}$ ions/cm$^3$ extending to a depth of at least 1500 Å from the surface of the monocrystalline silicon and a concentration of less than about $1 \times 10^{17}$ ions/cm$^3$ at a depth of 3000 Å from the surface of the monocrystalline silicon and free of dislocations.

* * * * *

UNITED STATES PATENT AND TRADEMARK OFFICE
CERTIFICATE OF CORRECTION

PATENT NO. : 4,534,806

DATED : August 13, 1985

INVENTOR(S) : Ingrid E. Magdo

It is certified that error appears in the above-identified patent and that said Letters Patent is hereby corrected as shown below:

Title page Col. 2,   directly below "Primary Examiner - Upendra Roy"

add --Attorney, Agent, or firm - T. Rao Coca--

Signed and Sealed this

Twenty-fourth Day of December 1985

[SEAL]

Attest:

DONALD J. QUIGG

Attesting Officer   Commissioner of Patents and Trademarks